United States Patent [19]

Grebinski

[11] Patent Number: 4,695,327

[45] Date of Patent: Sep. 22, 1987

[54] SURFACE TREATMENT TO REMOVE IMPURITIES IN MICRORECESSES

[75] Inventor: Thomas J. Grebinski, Sunnyvale, Calif.

[73] Assignee: Purusar Corporation, Sunnyvale, Calif.

[21] Appl. No.: 745,241

[22] Filed: Jun. 13, 1985

[51] Int. Cl.$^4$ .......................... B08B 5/00; B08B 30/00
[52] U.S. Cl. ........................................ 134/11; 134/28; 134/30
[58] Field of Search ............................... 134/11, 28, 30

[56] References Cited

U.S. PATENT DOCUMENTS

| | | | |
|---|---|---|---|
| 3,071,497 | 1/1963 | Hinson | 134/30 X |
| 3,078,701 | 2/1963 | Rand | 134/11 X |
| 3,085,918 | 4/1963 | Sherliker et al. | 134/30 |
| 3,106,928 | 10/1963 | Rand | 134/11 X |
| 3,460,990 | 8/1969 | Barday | 134/11 X |
| 3,727,620 | 4/1973 | Orr | 134/95 |
| 3,769,992 | 11/1973 | Wallestad | 134/144 |
| 3,970,249 | 7/1976 | Singer | 239/102 |
| 3,990,462 | 11/1976 | Elftmann et al. | 134/102 |
| 4,029,517 | 6/1977 | Rand | 134/11 |
| 4,061,504 | 12/1977 | Zall et al. | 134/30 X |
| 4,231,805 | 11/1980 | Petterson et al. | 134/11 |
| 4,303,454 | 12/1981 | Petterson et al. | 134/11 |

FOREIGN PATENT DOCUMENTS 1049099  2/1982  U.S.S.R. ................................. 134/11

*Primary Examiner*—Andrew H. Metz
*Assistant Examiner*—William G. Wright
*Attorney, Agent, or Firm*—Fliesler, Dubb, Meyer & Lovejoy

[57] ABSTRACT

A surface of an object, e.g., a semiconductor wafer, is treated to remove impurities, including those in microrecesses having minimum dimensions of ten microns or less. The object is positioned in a sealed chamber which has a limited number of potential spaceborne nucleation centers and is at a treating temperature, T. A condensable solvent is introduced into the chamber until its pressure is close to but below its vapor pressure at the temperature, T. This condition is maintained until a plurality of molecular layers of the solvent is adsorbed in the microrecesses. Then, the pressure of the solvent is increased to at least unity whereat it condenses in the microrecesses. Impurities can be removed from the microrecesses in this manner thus improving product quality.

10 Claims, No Drawings

SURFACE TREATMENT TO REMOVE IMPURITIES IN MICRORECESSES

DESCRIPTION

1. Technical Field

The invention is concerned with a method of treating a surface of an object to remove impurities in microcracks, microcrevasses, microtrenches, micropits and other microcrevasses having minimum dimensions of ten microns or less. The method is particularly useful for treatment of the surfaces of semiconductor wafers.

2. Background Art

In the processing of wafers used in the manufacture of integrated circuits and the like, it is necessary in various processing steps to accomplish etching of certain areas of the wafer, to remove photoresist coating which may be applied to the wafer, and to otherwise clean the wafer. The use of an acid is required in all of these processing steps.

An apparatus which is directed toward these processing steps is disclosed in U.S. Pat. No. 3,990,462, issued to Elftmann et al. As disclosed therein, wafers are disposed in cassettes which are in turn mounted on a rotary turntable. A central post defines a plurality of pairs of ports, each port being positioned to direct fluid therefrom onto an adjacent wafer as that wafer passes the port due to the rotary motion of the turntable. As disclosed in that patent, one port of each pair carries acid or water, while the other port carried gas, such as gaseous nitrogen, or air. Each pair of ports is positioned so that, with continuous fluid flow from that pair, an atomized fog-spray is provided to the wafer.

It will be understood that processing of such wafers must be done in an extremely even manner so that all parts of the wafer are processed properly and uniformly. This has been a problem in the type of apparatus disclosed in the above-cited patent. Furthermore, the processing of a wafer in such a system is relatively slow.

In U.S. Pat. No. 3,970,249 to Singer, secondary streams are alternatively applied to a stream of atomized particles by applying those particles to a substrate. The system thereof, however, is not applicable to processing semiconductor wafers, in particular the removal of material from a semiconductor wafer through etching, stripping or cleaning.

It is also known to utilize a semiconductor wafer processing apparatus which comprises a body defining first and second adjacent ports through which fluid may flow from the body, the ports being positioned so that fluid flow from the first port influences fluid flow from the second port, means for varying fluid flow from the first port, and means for supporting the wafer such that at least a portion of the fluid flow moves generally across a major surface of a so-supported wafer.

Of more general interest in this area are U.S. Pat. No. 3,769,992, to Wallestad and U.S. Pat. No. 3,727,620 to Orr.

Another process for cleaning semiconductor wafers is to contact them with a liquid solvent of the desired composition. The composition may be stirred or otherwise caused to flow across or against the surfaces of the wafers to provide somewhat of a washing action.

In each of the above methods and utilizing each of the above apparatus, the gross surface of the semiconductor wafer is very adequately etched, stripped, cleaned or otherwise treated. However, the microcracks, microcrevasses, microtrenches, micropits or other microrecesses on the surface are either inadequately treated or are not treated at all. When the wafers are washed beneath the surface of a liquid solvent, the interiors of the cracks are often not even wet because of surface tension and the entrapment of air. When various sprays are utilized to wash the surfaces of the wafers, overhanging portions of the microcracks, microcrevasses, microtrenches, micropits or other microrecesses will often prevent portions thereof from being contacted by the treating medium. As a result, such impurities remain and create undesirable surface portions on semiconductor wafers whereby an unfortunately high percentage of wafers must be discarded as being unacceptable.

3. Disclosure of Invention

In accordance with the present invention, a method is set forth of treating a surface of an object to remove impurities in microrecesses (including microcracks, microcrevasses, microtrenches, micropits and the like) which have minimum dimensions of ten microns or less. The treating method comprises positioning the object, with the surface exposed, within a sealed treating chamber having therein a limited number of potential space-borne nucleation centers at a treating temperature, T; introducing a condensable solvent into the chamber, the solvent being characterized in that it has a vapor pressure, $P^*$, at the treating temperature, T, until the pressure, P, of the solvent in the chamber is sufficient so that a plurality of molecular layers of the solvent is physically adsorbed in the microrecesses while maintaining the ratio of $P/P^*$ in the chamber below unity; and thereafter increasing the ratio $P/P^*$ until it reaches unity and the solvent condenses and wets the microrecesses.

When one operates in accordance with the present invention, the interiors of the various microrecesses are readily wet with the treating liquid. This is accomplished by first adsorbing layers of the treating chemical, while the chemical is still in the vapor phase, onto the interior surfaces of the microrecesses and then increasing the partial pressure of the treating chemical until it is present as a liquid. Since the interiors of the microrecesses are already, essentially, wet due to the adsorption of several molecular layers of the treating chemical (giving an equivalent density of the adsorbed layers which is at least as great as that of the liquid), the additional liquid treating chemical now wets the interiors of the microrecesses (since surface tension problems are virtually eliminated) and, substantially, fills them completely. The invention is particularly useful when combined with apparatus which can impel the treating chemical against the surface whereby physical scrubbing action can be combined with chemical cleaning action and with physical cleaning action.

BEST MODE FOR CARRYING OUT THE INVENTION

The present invention is based upon a recognition of the problem that occurs when one tries to wash, etch, or otherwise treat a surface which has microrecesses (microcracks, microcrevasses, microtrenches, micropits or the like) with the object in mind of cleaning off impurities, including impurities which are entrapped within such microrecesses. The term microrecesses, as used herein, includes only those microrecesses having a minimum dimension of ten microns or less. In such an instance, the interiors of the microrecesses are generally not adequately wet if the surface being treated is simply covered completely with a liquid. The reason for this is that the microrecesses have entrapped air bubbles and the like in them and the surface tension of the liquid is generally such that it will not flow down into the microrecesses. Indeed, even when one tries to overcome this problem by spraying liquid, even in an undulating manner, against surfaces having such microrecesses, one does not accomplish filling of the microrecesses because of shadowing caused by the walls of the crevasses, entrapment of air bubbles and the like, and the above-mentioned surface tension problem.

In accordance with the present invention, the object to be treated is positioned with the surface which is to be treated exposed, within a sealed treating chamber having therein a limited number of potential spaceborne nucleation centers. The temperature of the object is set at a desired treating temperature, T. It can be assured that the chamber contain only a limited number of potential spaceborne nucleation centers by first cleaning the chamber thoroughly and then evacuating it. The surface to be treated can also preferably be pre-treated as by impacting a stream of ionized chemically inert gas upon that surface. For example, the gas can be nitrogen or any of the noble gasses, i.e. helium, neon, argon, krypton, xenon, radon.

A condensable solvent is introduced into the chamber, the solvent having a vapor pressure, $P^*$, at the treating temperature, T. The solvent is introduced into the chamber until the pressure, P, of the solvent in the chamber is sufficient so that a plurality of molecular layers of the solvent is adsorbed in the microrecesses. A ratio of $P/P^*$ is maintained in the chamber below unity but is usually nearly unity. That is, the pressure is maintained just below that at which the solvent would condense into a liquid. Generally, seven to ten layers of the solvent are adsorbed on the entire surface of the object being treated, including the interior surfaces of the various microrecesses. The separation of adjacent solvent molecules is then as small as or smaller than the separation of molecules of the same solvent when in the liquid state. This is a relatively well known phenomenon and may be observed, for example, by admitting a condensible vapor into a chamber very quickly so that its pressure is just below saturation and immediately closing off the chamber. If one observes the pressure in the chamber, it will be noted that it will drop off slightly as the vapor is adsorbed and forms the aforementioned several molecular layers on exposed surfaces within or defining the chamber.

After sufficient of the solvent has been adsorbed on the surface so that a plurality of molecular layers of the solvent is so adsorbed in the various microrecesses, the ratio $P/P^*$ is increased until the solvent condenses and wets the microrecesses and elsewhere on the surface, i.e. until $P/P^*$ is equal to or greater than unity. This generally is done by increasing the pressure through addition of solvent, but it can also be accomplished by simply lowering the temperature of the object being treated. Condensation is continued as needed to provide a rinsing action. The liquid form of the solvent may advantageously be sprayed upon the surface to provide a scrubbing action.

The molecules of the adsorbed layers are quite close together, generally at least as close together as would be the molecules of a liquid aliquot of the same chemical at the same temperature. As a result, the top layers of the adsorbed molecules act like a liquid and when solvent is condensed after $P/P^*$ is increased, the solvent fully wets the top layer of adsorbed molecules and thereby fully wets and fills the microrecesses.

The solvent which is adsorbed on the surface and in the microrecesses may be adsorbed chemically, physically, or some combination of both. Examples of chemically adsorbed solvents including HCl, $NO_2$, HF, $SO_3$, $NH_3$, $H_2O_2$, $HCO_2H$ and $H_2O$. Examples of physically adsorbed solvents include $H_2O$, $NH_3$, isopropyl alcohol, tetrachloroethylene, and any of various solvents which may be specific for contaminants which may be present on the surfaces of the objects being treated. It is generally preferred that the solvents be condensable at some temperature below about 160° C.

The surface may be pretreated by adsorbing one or more of the above-listed or other appropriate solvent thereon in order to solvate particular impurities as described below. Thereafter, the solvent which is to be adsorbed and then condensed is introduced.

Following condensation of the solvent which is first adsorbed and then condensed, the surface may advantageously be bulk-rinsed by condensing generally distilled water vapor thereon and/or by spraying with liquid generally distilled water. Following the bulk-rinsing, the surface is generally dried with a hot ionized chemically inert gas, as set forth previously, generally being impinged upon the surface.

Generally, the evacuating of the chamber is to a vacuum of no more than about 0.7 times the vapor pressure which would be present in equilibrium with the particular solvent at the treating temperature T.

The invention will be better understood by reference to the following illustrative examples wherein various solvents are utilized to remove various contaminant materials from dielectric and semiconductor surfaces.

CLEANING PROCESS I

The purpose of this process is to remove residual thin films of organic materials from surfaces having microrecesses only a few molecules across in size. Sulfuric acid/hydrogen peroxide/water oxidative mixtures are used to remove organic contaminants by the action of sulfuric acid, with the hydrogen peroxide serving to form $H_2SO_5$ (Caro's acid) by the interaction of the two reactants. The process is carried out using sulfur trioxide vapor, an aqueous hydrogen peroxide vapor mixture and water vapor. Photoresist coatings, organic contaminants and alkaline earth metals are removed in this manner from semiconductor wafers.

Wafers are positioned in a chamber and the surfaces of the wafers are swept with dry ionized nitrogen to physically sweep away any loosely held particulates. Thereafter, the chamber is evacuated to a pressure of approximately 1 Torr to remove spaceborne particulates. Sulfur trioxide vapor is introduced into the chamber and adsorbed on the surface of the wafer. The sulfur trioxide vapor reacts with alkaline earth metals to form water soluble compounds thereof over a period of time. The pressure of the $SO_3$ vapor is not increased sufficiently to condense liquid $SO_3$. Sulfur trioxide vapor also reacts with any organic contaminants.

Water vapor is next introduced into the chamber and adsorbed onto the surface. The adsorbed layer then contains both adsorbed water vapor and adsorbed sulfur trioxide vapor which react to form sulfuric acid in the adsorbed layer after a period of time required to sufficiently complete the reaction. The pressures of $SO_3$ and water in the chamber are thereby greatly reduced.

Next, a mixture of SO₃ vapor and aqueous hydrogen peroxide vapor is introduced into the chamber at a pressure below the vapor pressure of both species at the temperature, T. This is adsorbed on the surface and reacts with the adsorbed surfuric acid to form $H_2SO_5$.

The partial pressure of the sulfur trioxide vapor and aqueous hydrogen peroxide vapor mixture is then increased sufficiently so that its liquid form is condensed on the surface of the wafers and drips rapidly therefrom.

Additional $SO_3$—$H_2O_2$ mixture is introduced, to maintain an imbalance in the cleaning system chemical potential. This process is continued until a nearly homogenous distribution of solvated contaminant byproducts is obtained within the adsorbed and condensed layers. This provides the transport phenomena for the contaminants to be extracted away from the surface.

Following the above, the wafers are bulk-rinsed with high purity and high pressure distilled water vapor which condenses on the wafer surfaces followed by drying with hot ionized nitrogen gas.

The above procedure is repeated a sufficient number of times to provide the cleaning required.

CLEANING PROCESS II

The purpose of CLEANING PROCESS II is to remove very thin films of organic materials such as photoresist materials and Group I and Group II metals. The process utilized is to first treat the semiconductor wafer surface with ammonia vapor, then with ammonia vapor and aqueous hydrogen peroxide vapor, and finally with water vapor.

The semiconductor wafers are positioned within a cleaning chamber and the surfaces of the wafers are swept with dry ionized nitrogen to physically sweep away any loosely held particulate. The chamber is evacuated to a vacuum of approximately 1 Torr. Ammonia is introduced into the cleaning chamber to solvate and complex some of the residual photoresist materials and the Group I and Group II species over a period of time. The pressure of ammonia gas is not increased sufficiently to condense liquid ammonia.

Ammonia and aqueous hydrogen peroxide vapors are next introduced into the chamber at pressures below their vapor pressures at the treating temperature of 50° C. to 100° C. and adsorbed on the wafer surfaces. The hydrogen peroxide acts as an oxidizing agent to oxidize residual organic materials and any metal contaminants. The partial pressures of the ammonia and of the aqueous hydrogen peroxide mixture are increased sufficiently so that their liquid forms are condensed on the surfaces of the wafers and drip rapidly therefrom. The vapors are swept across the wafer surfaces to provide sufficient agitation so that the condensed materials, with the solvated contaminants, drip rapidly from the wafers.

Additional mixture is introduced, to maintain an imbalance in the cleaning system chemical potential. This process is continued until a nearly homogenous distribution of solvated contaminant byproducts is obtained within the adsorbed and condensed layers. This provides the transport phenomena for the contaminants to be extracted away from the surface.

The bulk of the contaminants are removed with high purity and high pressure distilled water vapor which condenses on the surface and the surface is then dried with ionized nitrogen. The process may be repeated several times depending upon the extent of contamination attached to the surface. If the silicon surface is not be etched by the ammonia, it is desirable that at least the top layer of silicon be oxidized to form a protective coat prior to adsorbing the ammonia vapor.

CLEANING PROCESS III

This cleaning process serves to oxidize and solvate and remove heavy metal contaminants from semiconductor and dielectric surfaces. Hydrogen chloride/hydrogen peroxide/water mixtures are used to oxidize and complex heavy metal contaminants that are either chemisorbed or physisorbed onto semiconductor and dielectric surfaces. The hydrogen peroxide oxidizes heavy metals and the hydrogen chloride serves as a complexing agent. Water vapor can be used as a solvating agent for the reacted and complexed impurities. The process builds its cleaning chemistry on the surface to be cleaned. The components used include hydrogen chloride vapor, aqueous hydrogen peroxide vapor and water vapor.

The wafers to be cleaned are positioned in a chamber and their surfaces are swept with dry ionized nitrogen to physically sweep away any loosely held particulates. The chamber is evacuated to approximately 1 Torr. An aqueous hydrogen peroxide vapor mixture is introduced into the chamber to convert any exposed silicon into silicon dioxide. This provides a surface layer which is favorable to adsorption chemistry. Other reactive species can be used to induce a polar surface.

Next, hydrogen chloride vapor is introduced and adsorbed on the wafer surfaces to chemically react with surface contaminants in the first few surface monolayers over the period of time required for the reaction to take place. Next, a mixture of aqueous hydrogen peroxide vapor is introduced into the chamber. Sufficient of this mixture is introduced so that several monolayers are adsorbed onto the surface. The pH of the hydrogen peroxide adsorbate is adjusted, to a pH dependent on the nature of the contaminants, by the introduction of hydrogen chloride vapor. The combination of the above components, all adsorbed on the surface, react, complex and solvate heavy metal contaminants.

The partial pressure of the hydrogen chloride vapor-aqueous hydrogen peroxide vapor mixture is increased sufficiently so that its liquid form is condensing on the surface of the wafers and drops rapidly therefrom.

Additional mixture is introduced, to maintain an imbalance in the cleaning system chemical potential. This process is continued until a nearly homogenous distribution of solvated contaminant byproducts is obtained within the adsorbed and condensed layers. This provides the transport phenomena for the contaminants to be extracted away from the surface.

Thereafter, as in processes I and II, high purity and high pressure distilled water vapor is used to remove the bulk of the contaminants, followed by a hot ionized nitrogen drying. This procedure is repeated the number of times necessary to accomplish the required extent of cleaning.

CLEANING PROCESS IV

The purpose of this cleaning process is to remove contaminants from surfaces having small cracks and pores only a few molecules in size. In addition, this process serves for removing contaminants from a semiconductor surface that is hydrophobic. The process utilizes gaseous hydrogen fluoride at 100° C. and a mixture of gaseous hydrogen chloride, gaseous water, and gaseous hydrogen peroxide. This process serves to remove metals that can be complexed and solvated from hydrophobic semiconductor materials. The hydrogen fluoride gas is used to remove the oxide layer on the semiconductor surface. The hydrogen chloride gas is used to react with ionic species and the water is introduced to solvate and complex these species so that they can be easily removed. The hydrogen peroxide is used to enhance removal of heavy metal ions such as gold.

Semiconductor wafers to be cleaned are positioned in a chamber and their surfaces are swept with dry ionized nitrogen to remove loosely held particulate. Hydrogen fluoride vapor is introduced into the chamber at 100° C. Once a sufficient time, t, has passed, the chamber is purged with dry ionized inert, e.g. nitrogen, gas and evacuated to approximately 1 Torr. Hydrogen chloride gas is then introduced and adsorbed (but not condensed) on the semiconductor surfaces to react with surface contaminants within the first few monolayers.

A hydrogen chloride/water vapor mixture is introduced and adsorbed onto the wafer surfaces at a pressure below the vapor pressure of each component at the temperature, T. Water vapor is then condensed onto the surfaces as a rinse. Thereafter, hydrogen chloride vapor and aqueous hydrogen peroxide vapor are slowly introduced at pressures below their vapor pressures and added to the adsorbed layer to ensure that all microrecesses are filled over a sufficient period of time, t. The hydrogen peroxide/water vapor concentration is chosen to be such that it does not oxidize the semiconductor surface quickly. Water vapor is then condensed on the surface and the surface is thereby rinsed off. Hot ionized nitrogen is utilized to dry the surface. The above process is repeated sufficient times to provide the required degree of cleaning.

CLEANING PROCESS V

This process utilizes hydrogen fluoride vapor at 100° C. and a mixture of hydrogen fluoride vapor, ammonia vapor, aqueous hydrogen peroxide vapor and water vapor. This process serves to remove Group II, Group III and alkaline earth metals from hydrophobic semiconducting surfaces. The hydrogen fluoride vapor is used to remove the thin layer of oxide from the semiconducting surface. The ammonia vapor is used to wet the semiconducting surface so that the water vapor can be readily adsorbed. The water/ammonia vapor mixture serves to etch a silicon semiconducting surface which aids in the desorption of fluoride ions and solvation of other chemisorbed contaminants. The hydrogen peroxide vapor is used to retard the solvation process and to build a thin layer of oxide.

Semiconductor wafers to be treated are positioned in a chamber and the surfaces of the wafers are swept with dry ionized nitrogen to remove loosely held particulate. Hydrogen fluoride vapor is introduced at 100° C. to remove exposed native oxide over a sufficient time, t, required to do so. The chamber is purged with dry ionized nitrogen and then evacuated to a vacuum of approximately 1 Torr. Thereafter, ammonia vapor is introduced and adsorbed on the wafers to wet the silicon surface and to solvate soluble contaminants on the surface at a pressure below its vapor pressure for a sufficient amount of time to allow the solvation to occur. Next, a mixture of ammonia vapor and water vapor is added to the adsorbed layers on the surface at a pressure below its vapor pressure. Thereafter, an ammonia vapor-water vapor mixture is slowly introduced with an increase in its partial pressure approaching and then reaching its vapor pressure so that its liquid form is condensing on the wafer surface and dripping rapidly therefrom. Thereafter, high purity and high pressure distilled water vapor is condensed on the surfaces to remove the bulk of the contaminants followed by hot ionized nitrogen drying. This procedure is repeated the number of times necessary to accomplish the required extent of cleaning.

CLEANING PROCESS VI

The purpose of this cleaning process is to remove contaminants from surfaces having small cracks and pores only a few molecules in size and over a few monolayers in thickness. The contaminants to be removed are in the categories of metals and non-metals in the zero and ionic state and organic materials. The process utilizes the following treatment steps:
1. Sulfuric acid/hydrogen peroxide
2. Ammonia hydroxide/hydrogen peroxide
3. Hydrogen fluoride
4. Hydrogen chloride/water/hydrogen peroxide
5. Hydrogen fluoride
6. Ammonia/water/hydrogen peroxide This process is used to clean both the semiconducting surface and the dielectric surface. The first two chemical treatments are used to remove contaminants from the dielectric and the oxide layer deposited onto the semiconductor surface. The third treatment removes the oxide layer. The following treatments, 4–6, work on the semiconductor surfaces according to previously mentioned processes.

The process works as follows. First, CLEANING PROCESS I is carried out as set forth above. Then, CLEANING PROCESS II is carried out as set forth above. Next, CLEANING PROCESS IV is carried out. As a final step, CLEANING PROCESS V is carried out.

CLEANING PROCESS VII

The purpose of this cleaning process is to remove contaminants from surfaces having microrecesses. It is useful in the semiconductor industry to remove gold and other heavy chemically inactive metal contaminants from wafer surfaces.

The wafers are positioned in a chamber and their surfaces are swept with dry ionized nitrogen to remove loosely held particulate. Hydrogen fluoride vapor is introduced into the chamber at 100° C. Once a sufficient time, t, has passed, the chamber is purged with dry ionized inert, e.g. nitrogen, gas and evacuated to approximately 1 Torr. The chamber is evacuated and then the following steps are carried out:
1. Water vapor is then introduced and adsorbed onto the wafer surface.
2. Nitrogen dioxide vapor is then introduced until it is adsorbed on the surface and reacts with the adsorbed water to form nitric acid in situ.
3. Hydrogen chloride vapor is introduced to the chamber and adsorbed with the nitric acid to form aqua regia in situ.
4. Water vapor and nitrogen dioxide vapor are again introduced to the chamber and adsorbed on the wafer.
5. Hydrogen chloride vapor is again introduced into the chamber and adsorbed on the wafer to form another layer of aqua regia.
6. Water vapor is introduced into the chamber, and condensed on the wafer in sufficient quantity and for a sufficient time to solvate and remove contaminants and to rinse the wafer.

The foregoing description of the present invention has been presented for purposes of illustration and description. It is not intended to be exhaustive or to limit the invention to the precise form disclosed, and many modifications and variations are possible in light of the above teaching. Thus, the scope of the invention is as defined by the claims appended hereto.

What is claimed is:

1. A method of treating a surface of an object to remove impurities in microrecesses having minimum dimensions of 10 microns or less with a condensible solvent which has a vapor pressure, $P^*$, at a treating temperature, $T$, comprising:
   (1) positioning the object, with the surface exposed, within a sealed treating chamber having therein a limited number of potential spaceborne nucleation centers at said temperature, $T$;
   (2) introducing said solvent into said chamber until the pressure, $P$, of the solvent in the chamber is sufficient so that a plurality of molecular layers of the solvent is adsorbed in the microrecesses while maintaining a ratio of $P/P^*$ in the chamber below unity and below that at which substantial spaceborne nucleation of the solvent occurs; and
   (3) thereafter increasing the ratio, $P/P^*$, until the solvent condenses and wets the microrecesses.

2. A method as set forth in claim 1, wherein said positioning step includes placing said object in said chamber and evacuating said chamber to reduce the number of spaceborne nucleation centers therein to said limited number.

3. A method as set forth in claim 2, including, following said positioning step and prior to said introducing step:
   impacting a stream of ionized chemically inert gas upon said surface.

4. A method as set forth in claim 3, wherein said gas is nitrogen, helium, neon, argon, krypton, xenon or radon.

5. A method as set forth in claim 1, wherein said solvent is $HCl$, $NO_2$, $HF$, $SO_3$, $NH_3$, $H_2O_2$, $HCO_2H$, $H_2O$, tetrachloroethylene or isopropyl alcohol.

6. A method as set forth in claim 1, further including, following said increasing step:
   spraying the liquid form of said solvent upon said surface.

7. A method as set forth in claim 1, further including, following said positioning step and prior to said introducing step:
   pretreating said surface by adsorbing a pretreating solvent thereon.

8. A method as set forth in claim 1, further including, following said increasing step:
   bulk-rinsing said object by condensing water vapor thereon.

9. A method as set forth in claim 8, further including, following said bulk-rinsing step:
   drying said object with hot ionized chemically inert gas.

10. A method as set forth in claim 1, wherein said solvent is maintained in said chamber during step (2) for a time sufficient for said plurality of molecular layers of said solvent to be adsorbed in said microrecesses while said ratio of $P/P^*$ is maintained below unity and below that at which substantial space borne nucleation of the solvent occurs.

* * * * *